(12) United States Patent
Moraja et al.

(10) Patent No.: US 7,871,660 B2
(45) Date of Patent: Jan. 18, 2011

(54) PREPARATION OF GETTER SURFACES USING CAUSTIC CHEMICALS

(75) Inventors: Marco Moraja, Milan (IT); Marco Amiotti, Milan (IT); Costanza Dragoni, Perugia (IT); Massimo Palladino, Lainate (IT)

(73) Assignee: Saes Getters, S.p.A., Lainate (IT)

( * ) Notice: Subject to any disclaimer, the term of this patent is extended or adjusted under 35 U.S.C. 154(b) by 1163 days.

(21) Appl. No.: 10/988,012

(22) Filed: Nov. 12, 2004

(65) Prior Publication Data

US 2007/0065295 A1    Mar. 22, 2007

Related U.S. Application Data

(60) Provisional application No. 60/539,856, filed on Jan. 27, 2004.

(30) Foreign Application Priority Data

Nov. 14, 2003    (IT)    ............... MI2003A2209

(51) Int. Cl.
*B05D 5/12*    (2006.01)
(52) U.S. Cl. .............. 427/58; 438/638; 252/181.1; 428/615
(58) Field of Classification Search ........ 428/615; 438/638; 252/181.1; 427/58
See application file for complete search history.

(56) References Cited

U.S. PATENT DOCUMENTS

| | | |
|---|---|---|
| 3,214,381 A | 10/1965 | Baldauf |
| 4,630,095 A | 12/1986 | Otsuka |
| 5,520,563 A | 5/1996 | Wallace |
| 5,656,889 A | 8/1997 | Niiyama |
| 5,701,008 A | 12/1997 | Ray et al. |
| 5,837,935 A | 11/1998 | Carper |
| 5,882,727 A | 3/1999 | Corazra |
| 5,895,233 A | 4/1999 | Higashi |
| 5,921,461 A | 7/1999 | Kennedy |
| 5,952,572 A | 9/1999 | Yamashita et al. |
| 6,252,229 B1 | 6/2001 | Hays et al. |
| 6,469,909 B2 | 10/2002 | Simmons |
| 6,499,354 B1 | 12/2002 | Najafi |

(Continued)

FOREIGN PATENT DOCUMENTS

EP    0 837 502 A2    4/1998

(Continued)

OTHER PUBLICATIONS

H. Henmi, "Vacuum Packaging for Micro Sensors by Glass-Silicon Anodic Bonding", Sensors and Actuators A, 43 (1994), 243-248.

(Continued)

*Primary Examiner*—Michael Barr
*Assistant Examiner*—Andrew Bowman
(74) *Attorney, Agent, or Firm*—TIPS Group

(57) ABSTRACT

A technique for manufacturing a device that includes a deposit of getter material on a support involves treating the support on which the getter material is formed with a caustic fluid. An aspect of the technique is that it may clean and/or chemically activate the getter material without substantial damage to the getter material. The getter material may be formed on an internal wall of the device.

23 Claims, 6 Drawing Sheets

U.S. PATENT DOCUMENTS

| | | |
|---|---|---|
| 6,534,850 B2 | 3/2003 | Liebeskind |
| 6,590,850 B2 | 7/2003 | Eldredge et al. |
| 6,621,134 B1 | 9/2003 | Zurn |
| 6,635,509 B1 | 10/2003 | Ouellet |
| 6,897,551 B2 | 5/2005 | Amiotti |
| 6,923,625 B2 | 8/2005 | Sparks |
| 7,042,075 B2 * | 5/2006 | Liebeskind ............... 257/682 |
| 7,534,658 B2 | 5/2009 | Amiotti et al. |
| 7,566,957 B2 | 7/2009 | Amiotti et al. |
| 2002/0093003 A1 * | 7/2002 | Conte et al. ............ 252/181.1 |
| 2002/0151170 A1 * | 10/2002 | Maex et al. ............... 438/638 |
| 2003/0138656 A1 * | 7/2003 | Sparks .................... 428/615 |
| 2005/0158914 A1 | 7/2005 | Amiotti |

FOREIGN PATENT DOCUMENTS

| | | |
|---|---|---|
| JP | 08 210251 | 8/1996 |
| JP | 11-057466 (A) | 3/1999 |
| WO | WO 00/61832 | 10/2000 |

OTHER PUBLICATIONS

T. Corman, "Low APressure Encapsulation Techniques for Silicon Resonators", Royal Institute of Technology, Stockholm, 1998.

Jin, et al., "An Investigation on NEG Thick Filk for Vacuum Packaging of MEMS," Proceedings of the SPIE—The International Society for Optical Engineering SPIE-INT. Soc. Opt. Eng USA, vol. 4980, pp. 257-280, 2003.

International Search Report dated Aug. 31, 2005.

U.S. Appl. No. 12/150,287, filed Jul. 21, 2005, Amiotti, M. et al.

U.S. Appl. No. 11/070,728, filed Jul. 21, 2005, Amiotti, M. et al.

* cited by examiner

PREPARATION OF GETTER SURFACES USING CAUSTIC CHEMICALS

CROSS-REFERENCE TO RELATED APPLICATIONS

This application claims the benefit of Italian Patent Application No. MI2003A002209, filed Nov. 14, 2003, and Provisional Patent Application No. 60/539,856 filed Jan. 27, 2004, both of which are incorporated herein by reference.

BACKGROUND

The present invention relates to the preparation of getter materials, and more particularly to methods for cleaning and/or activating getter materials.

Getter materials have been used to selectively sorb gasses. For example, getter material includes zirconium, titanium, tantalum, niobium, hafnium and yttrium and alloys of at least one of these metals with one or more elements selected among the transition metals, Rare Earths and aluminum. Getter materials also include metal alloys, metal compounds (such as oxides and chlorides), and non-metallic materials.

Some getter materials are capable of reversibly sorbing hydrogen and substantially irreversibly sorbing gasses as oxygen, water, carbon oxides and, in some cases, nitrogen. Non evaporable getter materials, also known as "NEG," are often used for the maintenance of vacuum. The maintenance of vacuum is required, for example, in particle accelerators, X-ray tubes, field-emission flat panel displays, evacuated jackets for thermal insulation (such as in thermal vessels, e.g., Thermos® and Dewar bottles), and the pipes for oil extraction and transportation.

NEG materials can be also employed to remove reactive gasses when traces thereof are present in other gasses that are not reactive to the NEG materials, e.g. inert or noble gasses. An example, NEG materials may be placed within fluorescent lamps, which are filled with noble gasses at a pressure of some tens of mbar, so that the NEG material can remove traces of oxygen, water, hydrogen and other contaminants from the noble gasses. Another example is the purification of inert or noble gasses, particularly for applications in the microelectronics industry.

Miniaturized mechanical or electromechanical devices are generally known in the field as "Microelectromechanical Systems", or "MEMS", while the miniaturized devices of optical type are known as "Microoptoelectromechanical Systems" or "MOEMS". For the sake of simplicity, however, the definition MEMS will be used in the present text also with reference to MOEMS. MEMS generally comprise an active device (the micromechanical, microelectromechanical or optical part) and supplementary parts, enclosed in a sealed cavity, with electrical feed-throughs for power and the transmission of electrical signals.

The latest generation of MEMS is manufactured with technologies derived from the semiconductor manufacturing industry. These technologies include processes such as deposition, masking and etching. The processes can be used to manufacture miniaturized structures and geometries that are not obtainable or practical through traditional manufacturing techniques.

Among the main types of MEMS that are already in commercial use or that are in close-commercial, are: microaccelerometers such as those disclosed in U.S. Pat. No. 5,952,572 to trigger the deployment of automobile air bags; miniaturized mirrors such as those disclosed in U.S. Pat. No. 5,155,778 for use in optical fiber telecommunication systems; arrays of miniaturized mirrors, such as those disclosed in U.S. Pat. No. 6,469,821 and used in the formation of images; and microbolometers, e.g., miniaturized sensors of infrared radiation, such as those disclosed in U.S. Pat. No. 6,252,229.

Several ways for manufacturing MEMS have been proposed, but the most common ones use at least two planar supports made of glass, quartz, a ceramic material (e.g. silicon carbide) or a semiconductor material (silicon is preferred). The active and passive components of the MEMS are then constructed on the planar supports. Most commonly, the active parts are constructed on a first silicon support (e.g. the movable parts of a micromechanical device) while the second support (which may be made up of glass, quartz, a ceramic material or a semiconductor material) is used to enclose the finished device. The two supports are configured to create a cavity, often held at a low pressure or "vacuum," which houses the MEMS mechanism. That is, the MEMS mechanism is typically enclosed (or "housed") within a cavity or chamber bounded, at least in part, by the supports. The electrical feed-throughs for transferring the signals between the inside and the outside of the MEMS and for providing power can be provided with respect to either or both supports.

Once all the components necessary for the operation of the MEMS have been manufactured, the supports are bonded together. The microdevice is thus sealed in a closed space and is mechanically and chemically protected from the outside.

Numerous techniques for attaching the two supports together will be collectively referred to herein as "bonding." A first possibility is welding, either by the application of heat ("simple welding"), pressure ("pressure bonding"), or both. Typically, with welding, a malleable metal such as indium, lead or gold is interposed between the two supports, and is then melted and allowed to re-solidify in the case of simple welding, or pressed between the substrates, in the case of pressure bonding. Pressure bonding, in particular, has not been found to be completely reliable.

Another type of bonding is anodic bonding, used especially in the case in which one of the two supports is made up of glass or quartz and the other of silicon. With anodic bonding, the two parts are heated to a temperature of between about 300-500° C., and a potential of about 1000V is applied between the supports. Under these conditions, there is a migration of positive ions from the support kept at the more positive potential (for example, sodium ions from the glass) toward the support kept at the more negative potential, and a migration of negative ions (for example, oxygen from silicon) in the opposite direction which results in mutual welding at the interface between the two supports.

Another bonding technique is eutectic bonding, wherein a layer of a metal or alloy capable of forming a eutectic composition with the material of at least one of the two supports in interposed between the two supports. A eutectic (exothermic) reaction then causes a localized melting and welding of the two materials.

Finally, another bonding technique includes direct bonding, which comprises the localized high-temperature melting of the material of the supports. Unfortunately, this process generally requires very high temperatures, for example about 1000° C. in the case of the silicon, which may damage the component parts of the microdevice.

Generally, all the types of bonding described above require a previous treatment of the support surfaces to be fixed to each other, because unprepared surfaces may reduce the effectiveness of the welding. One class of treatment is mechanical in nature (e.g., gas-blowing or scrubbing with solid $CO_2$). This treatment can, among other things, remove particles present in the welding area. Another class of treatment is of a chemical type that alters the composition of the surface. This treatment can, among other things, eliminate contaminant species (e.g., oxides). Chemical treatments generally involve applying acidic or basic solutions, or combinations thereof, in sequence to the supports.

MEMS devices often require a particular atmosphere for their operation. For example, microbolometers must be maintained under very low pressure or vacuum conditions, because traces of gasses, if any, could give a convective contribution to the heat transportation in the system which could distort the measurement. MEMS with moving parts are often in vacuums, or low pressure or inert atmospheres. The humidity of the atmosphere must often be controlled because the molecules of water present on the surface of the different parts that comprise the microdevice may give rise to adhesion phenomena or modify the friction between the stationary parts and the moving parts, thus modifying the mechanical characteristics of the system. The control of the inner atmosphere, regardless of pressure (which may vary from vacuum to pressurized), of a MEMS is, consequently, generally extremely important for proper operation.

There are multiple phenomena that tend to deteriorate the quality of the inner atmosphere of a MEMS. Welding is one such phenomenon. Even if properly done, welding between two supports inevitably results in microscopic cracks through which gasses may pass into a cavity housing a device or active element of a MEMS.

A second phenomenon that can contribute to the deterioration of the atmosphere of a MEMS is outgassing. Gasses sorbed from the device and/or the supports tend to be released into the cavity housing the device or active element of the MEMS. MEMS have a very high ratio between inner surface area and cavity volume such that a relatively large concentration of outgassing occurs in a very small volume. Accordingly, though this problem is common to practically all devices under vacuum or in a controlled atmosphere, outgassing is particularly felt in the case of MEMS. Even though the inflow of gas into a MEMS cavity due to these two phenomena is small, it tends to be cumulative over the life of the device, so that over long periods of time, the aggregate effect is substantial.

A third phenomenon that can contribute to the deterioration of the atmosphere of a MEMS finds its origin during the manufacturing process of the MEMS. More particularly, the welding of the two supports frequently requires high temperatures, from some hundreds of degrees up to about 1000° C. or more, resulting in the release of relatively large amounts of gasses which can become entrapped within the cavity of the MEMS devices.

To obviate these problems, the MEMS manufacturers use NEG materials to absorb gasses. However, in contrast to traditional manufacturing techniques, wherein the different parts of a device are separately manufactured and finally assembled, with MEMS, generally all the components of a device are manufactured in series on one or two supports. This raises the general problem of compatibility between each material deposited on a support with all the subsequent manufacturing steps. When there is an incompatibility between a material and a process step, the material already deposited must be temporarily protected, for example with polymeric materials that are removed after the critical operation has been made. However, this process increases the complexity and time of manufacture and, as such, consequently increases cost.

The existence of at least some of the problems related to MEMS manufacture is acknowledged, for example, in U.S. Pat. No. 6,252,229 of Hayes et al. In particular, it has been acknowledged in the prior art that NEG, once deposited on a support, needs to be protected until the end of the manufacturing process due to its high chemical reactivity. In particular, in the prior art, the treatment of a support with caustic materials (e.g. acidic or basic baths) after NEG material is deposited thereon was considered to be destructive to the NEG.

This problem is the subject of the published patent application US-A1-2003/0138656 of Sparks, which discloses a method for manufacturing a support with a getter deposit, particularly for use in MEMS. Sparks expressly teaches that the getter is a fragile component of the system, and must be protected from the moment it is manufactured until the end of the manufacturing cycle of the MEMS. For this purpose, Sparks suggests that the getter material be covered with a layer of a few nanometers of a noble metal, such as gold, which is inert and resistant to gasses and to chemical reagents used in the different manufacturing steps of the MEMS which typically follow the getter deposition step. Sparks teaches, as a final or "bonding" step in the manufacturing process, the high temperatures of the bonding process cause the protective layer of noble metal to diffuse in the underlying material, thereby exposing the getter surface to the atmosphere within the cavity of the MEMS.

The above mentioned U.S. Pat. No. 6,252,229 of Hayes et al. proposes a manufacturing process that includes a double-step bonding. The double-step bonding includes a first "pressure bonding" step along a continuous closed line around the cavity to obtain a gas first bond, and a second bonding step, for example of anodic bonding, creating a second bond outside of the first bond, to create a mechanically resistant welding of the two supports. This process is said to reduce leakage into the cavity of the MEMS and, as such, is said to eliminate the need for a getter in the cavity. However, Hayes et al. do not address the problems of outgassing or gasses trapped during the manufacturing process. Furthermore, the two step process is much more complicated and expensive than a single step bonding process.

U.S. Pat. Nos. 6,621,134 and 6,635,509 disclose processes wherein the MEMS are manufactured starting from a single support, thus avoiding the problem of the bonding with a second support. These patents indicate the presence of a getter material. However, since the step of formation of the NEG deposit takes place almost at the end of the process, the getter is deposited externally to the cavity. Small openings are provided in the walls of the support to allow gettering through the wall openings. The amount of getter available through the holes is extremely limited, and the getter life is reduced by its placement outside of the cavity.

U.S. Pat. No. 5,701,008 discloses a microbolometer manufactured starting from two supports and containing a getter material. As far as the description of the manufacturing process is concerned, however, this document refers to a previous U.S. Pat. No. 5,433,639, which relates to the manufacturing process of a sensor of infrared radiation of traditional type (not a MEMS) wherein the different components are manufactured in parallel and assembled at the end. As such, the process of U.S. Pat. No. 5,433,639 is not directly applicable to U.S. Pat. No. 5,701,008, at least with respect to the integration of the getter within a cavity, and therefore this last document is of limited value in addressing the above-identified problems.

U.S. Pat. No. 6,590,850 mentions the general use of a getter in a MEMS and discloses the location thereof, but it does not disclose the manufacturing process of the devices and consequently does not mention how to introduce the getter therein. U.S. Pat. No. 5,952,572 is even more indefinite, mentioning only the use of a NEG, a combination between titanium and an alloy Zr—V—Fe, without disclosing either the location of the getter in the cavity or, even less, the step of introducing the NEG in the cavity.

The efficient integration of getter material into a chamber of a MEMS during the manufacturing process is still an open problem, and that the solutions proposed up to now are complicated, ineffective and expensive.

SUMMARY

Aspects of exemplary embodiments of the present invention provide processes free from certain problems heretofore encountered when manufacturing devices including getter materials.

In certain embodiments, it has been discovered that chemical treatments with caustic fluids such as acidic or basic (or combination in sequence thereof) solutions enhance the properties of the getter material. This is directly contrary to the conventional belief by those skilled in the art that exposure to such caustic fluids should be avoided to prevent a decrease the gas sorbing properties of the getter material, an increase in the loss of particles, and the possible detachment of the getter material from the support. Even more surprisingly, it has been found that treatment with certain caustic materials enhances the gettering activity of the getter material. For example, treatment with certain caustic materials appears to provide a chemical activation of the getter material.

A technique for manufacturing a device includes treating a support on which a getter material has been formed. The treatment is accomplished without isolating or otherwise protecting the getter material from fluids that are used to treat the support.

An example of a process according to the technique is directed to the chemical preparation of getter material surfaces. Such a process may include forming a deposit of a non-evaporable getter material on a support, treating the support having the deposit of the non-evaporable getter material with a caustic solution, and coupling the treated support to a device. The non-evaporable getter material may be located within a cavity of the device. The device, when operationally configured, may rely upon the presence of the non-evaporable getter material for sorption of gasses in the cavity.

The getter material can be formed by a variety of processes including chemical and physical deposition techniques. For example, the non-evaporable getter material may be formed by sputtering.

In an exemplary embodiment, the caustic fluid contacts at least one surface of the non-evaporable getter material. This may or may not enhance the gettering capabilities of the getter material. In another exemplary embodiment, the treatment enhances the gettering capabilities of the getter material while maintaining the structural integrity of the getter material. By "structural integrity" it is meant that the getter material does not fall apart or disintegrate to any substantial degree nor does the getter material lose significant markers of particles or detach, in whole or in part, from the support. In another exemplary embodiment, the contact with the surface is facilitated by making no recourse to the expedients of the prior art, such as temporary protective layers.

In an exemplary embodiment, the process includes treating the support in a basic solution, possibly including ammonia, and treating the support in an acidic solution, possibly including hydrochloric acid, hydrofluoric acid, nitric acid, or sulfuric acid. The treatment with the basic solution may precede the treatment with the acidic solution. The treatments may be in series and may be repeated one or more times.

In an exemplary embodiment, multiple caustic fluids can be used in sequence or, in some cases, concurrently. For example, the getter material can be treated with a first caustic fluid and subsequently with a second caustic fluid. In an exemplary embodiment, the first caustic fluid can be primarily basic (e.g. hydrous ammonia) and the second caustic fluid can be primarily acidic (e.g. hydrochloric acid). Rinsing with deionized (DI) water (and possible drying) can proceed, follow, or be interspersed with the caustic fluid treatments.

In an exemplary embodiment, the process is used in the manufacture of a miniaturized micromechanical, microelectromechanical, or optical device. In another exemplary embodiment, the support is a cap-wafer part of a micromechanical, microelectromechanical, or optical device. In another exemplary embodiment, an active component of a micromechanical, microelectromechanical, or optical device is coupled to the support.

Certain exemplary manufacturing processes facilitate the manufacture of devices containing getter materials without damage to the getter materials despite the unprotected contact of the getter materials with acidic or basic solutions. Moreover, in an exemplary embodiment, the process may be used to at least partially activate the getter material. For example, the gas sorbing capabilities of the getter material is enhanced in a "chemical activation" process. The chemical activation can then be optionally followed by a traditional thermal activation of the getter material.

There are a variety of getter materials that can be used. For example, the getter material can be selected from the group consisting essentially of zirconium, titanium, tantalum, niobium, hafnium and yttrium and alloys of at least one of these metals with one or more elements selected among the transition metals, Rare Earths and aluminum. Other getter materials are also suitable for other embodiments of the present invention. For example, metal alloys, metal compounds (such as oxides and chlorides), and non-metallic getters are considered to be suitable for certain embodiments of the present invention.

A method for chemically preparing getter material surfaces includes physically configuring a getter material for a desired application, treating the getter material with a fluid to remove contaminants, and sealing the treated getter material in a cavity of a device. In an exemplary embodiment, at least some of the fluid contacts a surface of the getter material when the getter material is treated. When operationally configured, the device relies upon the getter material for sorption of gasses in the cavity.

The treatment may include contacting at least one surface of the getter material with a caustic fluid to enhance the gettering capabilities of the getter material. Preferably, this does not degrade the structural integrity of the getter material.

In an exemplary embodiment, the fluid is a predominantly acidic fluid. For example, the fluid may include hydrochloric acid, hydrofluoric acid, nitric acid, sulfuric acid, or some other acidic substance. In another exemplary embodiment, the fluid is a predominantly basic fluid. For example, the fluid may include a hydrous ammonia solution. In another exemplary embodiment, the fluid is a first caustic fluid, and the method further includes treating the getter material with a second caustic fluid. The first caustic fluid may be primarily basic and the second caustic fluid may be primarily acidic. For example, the first caustic fluid may include hydrous ammonia and the second caustic fluid may include hydrochloric acid.

In an exemplary embodiment, the method further includes configuring the getter material as part of the device. The device may be, for example, a micromechanical, microelectromechanical, or optical device. In an embodiment, the getter material is formed on or as a cap for the device. In an alternative exemplary embodiment, the getter material is formed on or as a base for the device.

Other exemplary embodiments include devices fabricated with a caustic cleaning and/or activation process according to embodiments.

These and other embodiments and aspects of the present invention will become apparent to those skilled in the art upon a reading of the following detailed descriptions and a study of the several figures of the drawings.

DETAILED DESCRIPTION

An emerging application is the use of non-evaporable getter material ("NEG") in microelectromechanical systems ("MEMS"). Since MEMS devices are industrially important, and since the method of the invention is particularly compatible with the manufacturing process of the same, in the following description reference will be particularly made to these devices and processes, but it is to be intended that the present method has general applicability in a variety of systems, devices, apparatus, etc. wherein a getter material is used.

Exemplary embodiments of the present invention are particularly well suited, among other things, for use in the manufacturing process of devices of the MEMS type and, more particularly, for MEMS devices including at least two weld-bonded supports, upon one of which the getter is supported. The support used in these processes are preferably thin slices of silicon, glass or quartz or ceramic, typically called "wafers", which generally have a thickness of about 0.2-2 millimeters and diameters between about 10 and 30 centimeters. On these wafers there are formed, by different techniques, the active parts of the MEMS device and NEG deposits.

There can be hundreds to some thousands (or more) of MEMS devices produced on a single wafer. NEG may be deposited on the same support on which the active part of the device is constructed (or from which is obtained). The active part can be of a variety of types, as will be appreciated by those skilled in the art, including, for example, those with a moving part or parts, or a sensor of electromagnetic radiation. In an exemplary embodiment, the NEG is deposited on a second support that is used to close the device (referred to as a "cap wafer"). Since the cap wafer typically has more available space, it may be possible to deposit a greater amount of getter on the cap wafer. It may be further advantageous to deposit on the cap wafer because that reduces incompatibility problems between the deposition of the NEG and the presence of the active structures on the wafer.

Figure 1:
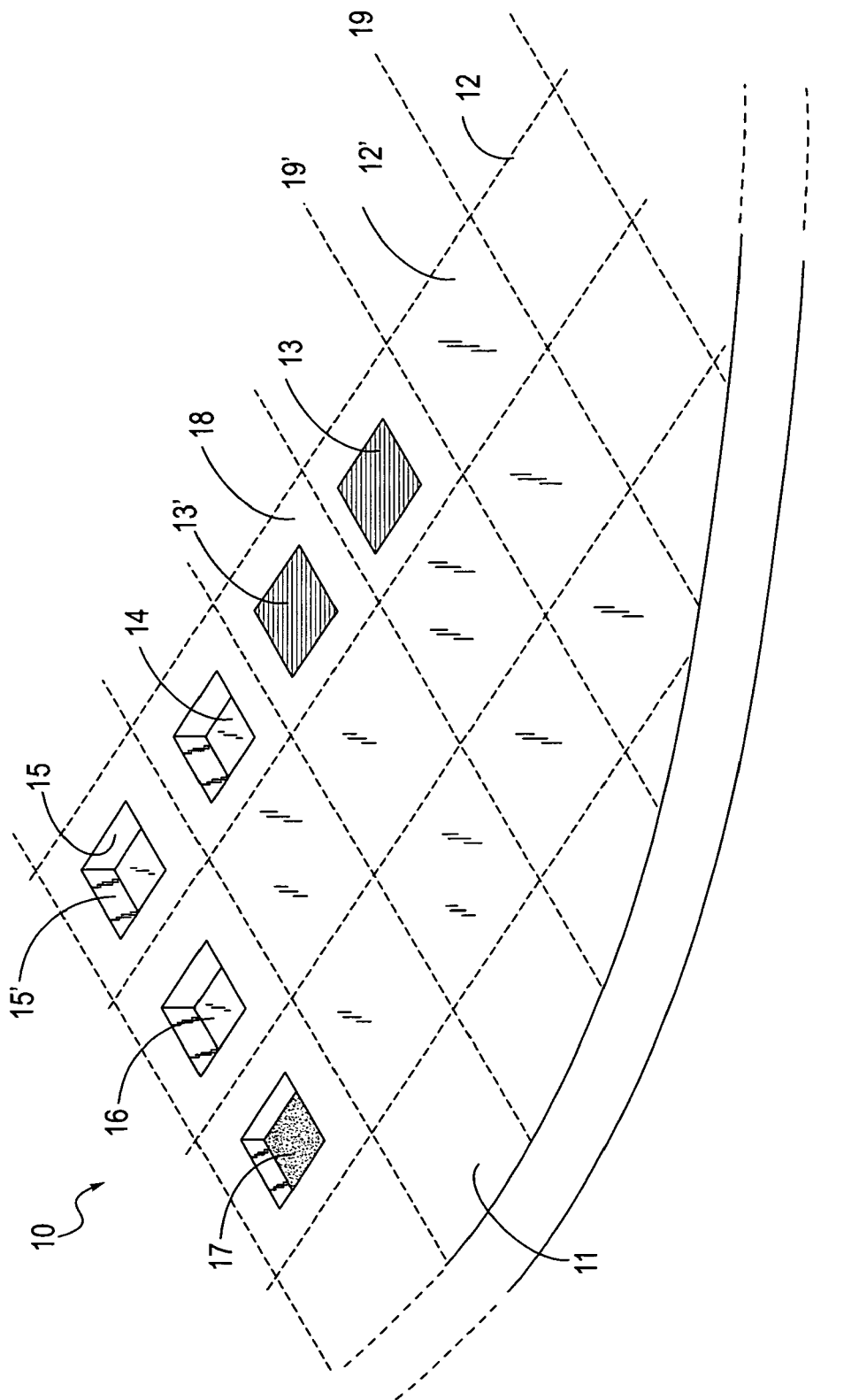
FIG. 1 depicts a part of a support that may be used in the manufacture of devices according to an embodiment.

FIG. 1 shows a part of a cap wafer 10 on which a plurality of NEG deposits 17 (one being shown for exemplary purposes) are present. For the purposes of this discussion, the cap wafer 10 is represented by some different areas thereof at different working steps, it being understood that in the actual processes the various parts of its surface will be at the same manufacturing step.

In the example of FIG. 1, the cap wafer 10 has an upper surface 11, which may be conceptually divided into areas 12, 12', ... (defined in FIG. 1 by broken lines 19, 19', etc.), each of which may be used to define the region of a single MEMS. At about the center of each area 12, 12', ..., at a location 13, 13', ..., there is obtained, for example through anisotropic chemical etching by processes well known to those skilled in the art of semiconductor manufacture, a recess 14. In this example, the recess 14 is defined by four vertical or sloping walls 15, 15', ..., and a bottom wall 16. Other shapes and configurations are also usable.

In the example of FIG. 1, on at least one of the walls 15, 15', ... or bottom wall 16 a NEG deposit 17 is produced. For example, the NEG deposit 17 may be formed at least on the bottom wall 16. In an embodiment, the bottom wall 16 offers the greatest surface area. One common technique for deposition of getter in MEMS manufacture is by "sputtering," which, in most cases, would tend to primarily deposit sputtered material on the bottom wall 16 of the recess 14.

The getter material used may be any NEG, for example, a metal as zirconium, titanium, tantalum, niobium, hafnium or yttrium, or alloys of at least one of these metals (preferably zirconium or titanium) with one or more elements selected among the transition metals, Rare Earths and aluminum. Also, compounds of metals and alloys, such as metal oxides, may be employed, as well as non-metallic getter materials and absorbers.

Each or at least one area 18 is preferably subjected to chemical treatments for the cleaning thereof prior to the aforementioned bonding process. In the semiconductor industry there are provided numerous washing baths for semiconductor wafers that allow a variety of washing solutions including both acidic and basic solutions. One representative wet cleaning method in the semiconductor industry well known to those skilled in the art is RCA cleaning, which is suitable for the removal of organic, metallic, and particulate contamination on wafer surfaces.

Typical washing solutions are, for example, SC1 and SC2, in which the wafer is immersed in sequence. The SC1 solution is formed of one part (by volume) of ammonium hydroxide, one part of oxygenated water and five parts of distilled water, and is usually used at temperatures ranging between about 60 and 80° C. The SC2 solution is formed of one part of hydrochloric acid, one part of oxygenated water and six parts of distilled water, and also, in this case, is used at temperatures of about 60-80° C.

After washing a wafer with the SC2 solution, and optionally also between the SC1 solution and the SC2 solution, the support is generally washed with distilled water. The SC1 solution accomplishes a soft chemical attack of the surface of the wafer, removing organic contaminants and particles which adhere to the surface, while the SC2 solution removes metallic contaminants.

Another solution commonly used in the semiconductor field is a solution that is 65% by weight nitric acid in water, which is typically used at temperatures ranging between room temperature (e.g. 20° C.-25° C.) and about 120° C. After treatment with this solution, the wafer is again usually washed with distilled water.

Other common semiconductor wafer washing techniques are with aqueous solutions of hydrofluoric or sulfuric acid at different concentrations. An extensive description of the different washing solutions used in the field, and of their effects on substrates, are described in the book *Handbook of Semi-* conductor Manufacturing Technology, by Y. Nishi and R. Doering, published in 2000 by Marcel Dekker, Inc. publisher, incorporated herein by reference. (In particular, see pages. 87-104).

In an embodiment, one or more of the exemplary caustic fluid treatments mentioned above, or similar thereto, is applied to the entire exposed surface of the cap wafer 10, as well as the walls of the recesses 14 free of the getter and the getter itself. This is done without the necessity of masking for the temporary protection of the getter materials, as required by prior art processes.

The treatment cleans the surface of the getter material, which can activate the getter material. Prior art activation typically avoids the use of chemicals, opting instead for thermal treatment, because the getter material is very reactive. Chemical reactions were thought to reduce gas sorption properties, detach particles, or, in the case of supported getters, peel getter material from a support. Accordingly, the getter material has been protected from chemicals during treatment. Wet cleaning steps were considered especially unsuitable for patterned materials, such as patterned getter materials deposited on silicon wafers because of caustic reactions with the getter materials, which often include metals, oxides of metals, and other materials generally considered to be incompatible with highly caustic chemicals.

According to an embodiment, caustic chemicals can be used for activation. Advantageously, an improving effect has been found when using cleaning baths standard in the semiconductor industry. The technique may be used with both supported getters (e.g., films of getter material on a surface) or unsupported getters (e.g., pills of getter material).

A finished cap wafer 10, wherein each or at least one recess 14 has internally a deposit of NEG, is then placed over the support (not shown) on which the active components of the MEMS are constructed. In an embodiment, the recesses 14, at least partially filled with getter material, align with corresponding areas on the surface of the other support wherein the active components of the MEMS devices are located (not shown). These areas on the other support may be recessed, flat, or otherwise, depending upon the application. The welding between the cap wafer 10 and the support on which the active components of the MEMS are present is carried out in area 18. The area 18 is the peripheral area of the surface 11 surrounding each or at least one recess 14. The welding may be carried out by any known method, for example with anodic or eutectic bonding, as will be appreciated by those skilled in the art.

Once the bonding has been carried out between the cap wafer 10 and the support on which the active components of the MEMS device are constructed, the single devices may be separated by cutting along the broken lines 19, 19', . . . . As a result, an aspect of certain embodiments allow for an uncomplicated, efficient and economical manufacturing processes for MEMS having internal NEG materials.

Figure 2:
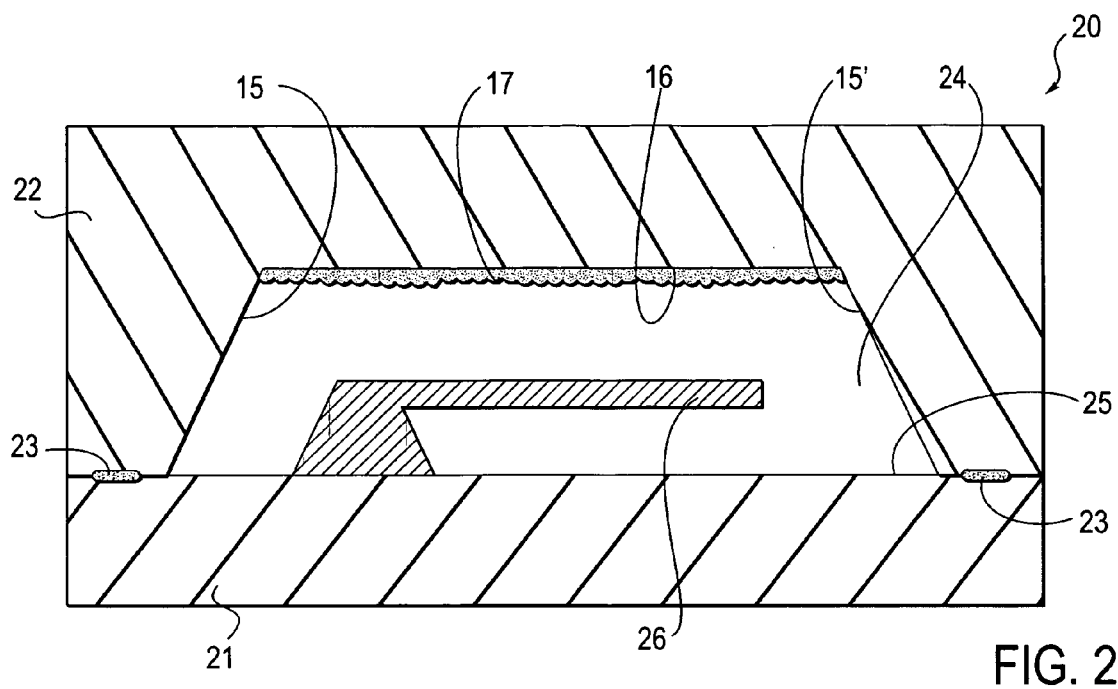
FIGS. 2 and 3 depict simplified cross-sectional views of exemplary devices containing getter material.

FIG. 2 shows in a simplified cross-section a MEMS device which may be manufactured through an exemplary process. A device 20 is formed by joining a wafer part 21 and a cap-wafer part 22, joined together by a welding 23. Each of these two parts may originate from a support of bigger dimension (e.g. an entire wafer and cap wafer), and in particular the part 22 originates from a support, such as the cap wafer 10 (FIG. 1), which may be cut along the broken lines 19, 19', . . . (FIG. 1). The cutting may be carried out after the welding operation of the two supports.

In the example of FIG. 2, a cavity 24 is defined between the parts 21 and 22. The cavity 24 may be under vacuum or contain a controlled atmosphere. The cavity 24 is defined by surface 25 of the wafer part 21, and by wall surfaces 15, 15', . . . and 16 (see also FIG. 1). On the wall 16 of the cap-wafer part 22 there is, in this example, a deposit of NEG material 17. An active part 26 of the MEMS device is housed within the cavity 24. For the sake of simplicity, certain other elements associated with the device are not shown, e.g., such as electrical feed-throughs connecting the part 26 with the outside of the device. Other elements associated with the device are well known to those skilled in the art.

Figure 3:
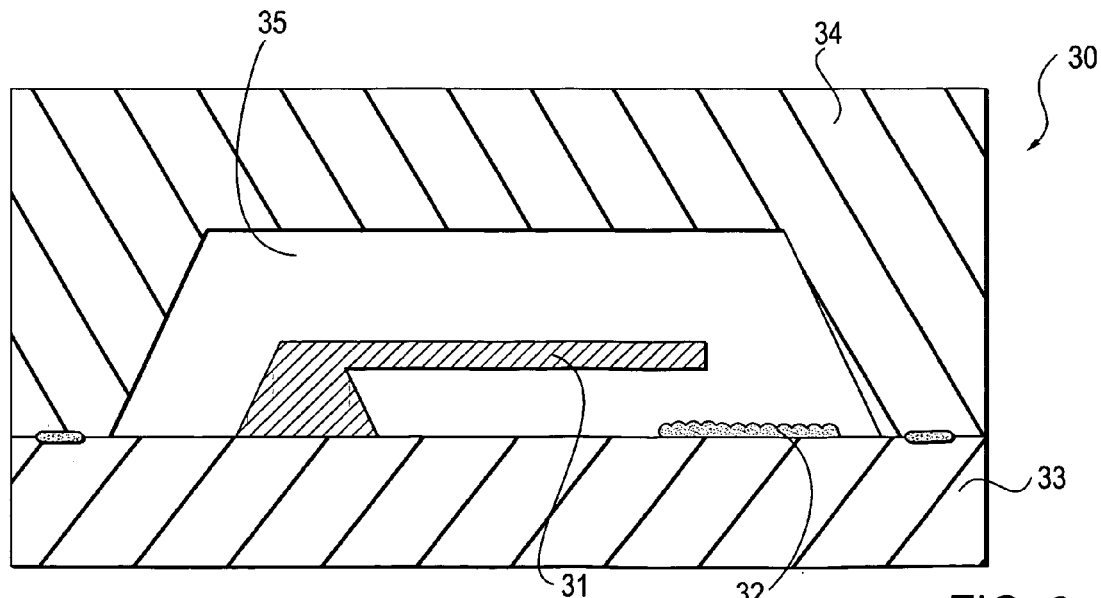

FIG. 3 shows another possible MEMS device 30, according to another exemplary embodiment. In this case, both the active part 31 and the getter deposit 32 are formed on the same part of wafer part or support 33, while the cap-wafer part 34 acts, in this case, simply as closing element of cavity 35. This structure, however, has the disadvantage that the space available for the getter deposit 32 may be smaller (with a consequent reduced gas sorbing capability) and the production of both deposit 32 and part 31 on a part 33 of the same support may be more complex.

The formation of the getter deposit 17, 32 (FIGS. 2 and 3, respectively) on one of the two supports may be effected according to several techniques including, by way of example but not limitation, evaporation, sputtering, and deposition techniques. In an exemplary embodiment, a sputtering technique is used, which is a common technique on which the manufacture of miniaturized devices on planar supports, and thus also of MEMS, is based. The sputtering technique deposits films with a thickness from fractions of micrometers (micron, μm) up to some tens of microns. Such films have an excellent adhesion to the substrate and are resistant to the loss of particles. With sputtering it is also possible to control (at least within certain limits) the morphology of the deposit, optimizing the same for the expected application. For example, a columnar morphology may show a high specific surface (surface per unit of weight of the deposit). Moreover, with this technique it is possible to control with a high precision level even the lateral location of the deposit, ensuring the getter deposit 17, 32 is properly aligned with the device 20, 30 (FIGS. 2 and 3, respectively).

The getter deposit 17, 32, even if it has already been chemically activated during the treatment with the cleaning chemical solutions of the surfaces of the two supports prior to bonding in accordance with an aspect of the present invention, preferably also undergoes a further thermal activation during the bonding of said supports. That is, most bonding operations involve the heating of the two supports to greater or lesser degrees, elevating the temperature of the MEMS devices. At these elevated temperatures all the components of the MEMS devices tend to release gasses. While the bonding operation is usually carried in a chamber that is pumped down to remove these gasses, in the final step of the bonding the cavity of the device is closed. When the cavity is closed, pumping from outside becomes ineffective.

Having an activated getter device within the cavity during the bonding process helps to eliminate the undesirable gasses that are outgassed from the MEMS materials during the bonding processes. This results in the more reliable production of MEMS devices. An aspect of an embodiment is the chemical pre-activation of the getter prior to the bonding step, because it increases the period of time in which the getter material can sorb outgassing produced by the bonding process.

Aspects of embodiments will be further illustrated by the following examples. Other embodiments and aspects of embodiments will become apparent to those skilled in the art upon a reading of the specification and a study of the drawings.

Example 1

In this example, the compatibility of a support having a deposit of getter material with a combined treatment with SC1 and SC2 solutions is determined.

Three silicon sample disks of 2.5 cm of diameter having a deposit of 2 μm of an alloy made up of zirconium, cobalt and Rare Earths are produced by sputtering. The alloy is produced starting from a target of alloy St 787™, marketed by SAES Getters, SpA of Lainate, Italy. Methods for making and using St 787 alloys can be found in U.S. Pat. No. 5,961,750, incorporated herein by reference. A first sample disk thus produced is not treated further, and constitutes the reference sample for this test. A second sample disk is immersed for 15 minutes in a bath of SC1 solution kept at 80° C., and then taken out, washed with distilled water and dried with a flow of dry nitrogen. A third sample disk is first immersed in the SC1 solution and then in the SC2 solution, for a period of 15 minutes for each bath, then washed with distilled water and dried with dry nitrogen.

The three sample disks are then initially subjected to a visual analysis using an optical microscope to check the morphology of the sample and the possible detachment from the support. This first examination confirms that after the SC1 and SC2 solution baths, there is no discernable detachment of the deposit from the support, and that the samples treated with the baths do not lose particles.

Subsequently, the three sample disks are assembled in vacuum benches and activated with a treatment under vacuum at 450° C. for 45 minutes. Next, the sample disks are allowed to cool to 25° C. and their characteristics of sorbing hydrogen and carbon monoxide (CO) are measured, according to the procedure defined in the standard ASTM F 798-82, with a testing pressure of $10^4$ Pa.

Figure 4:
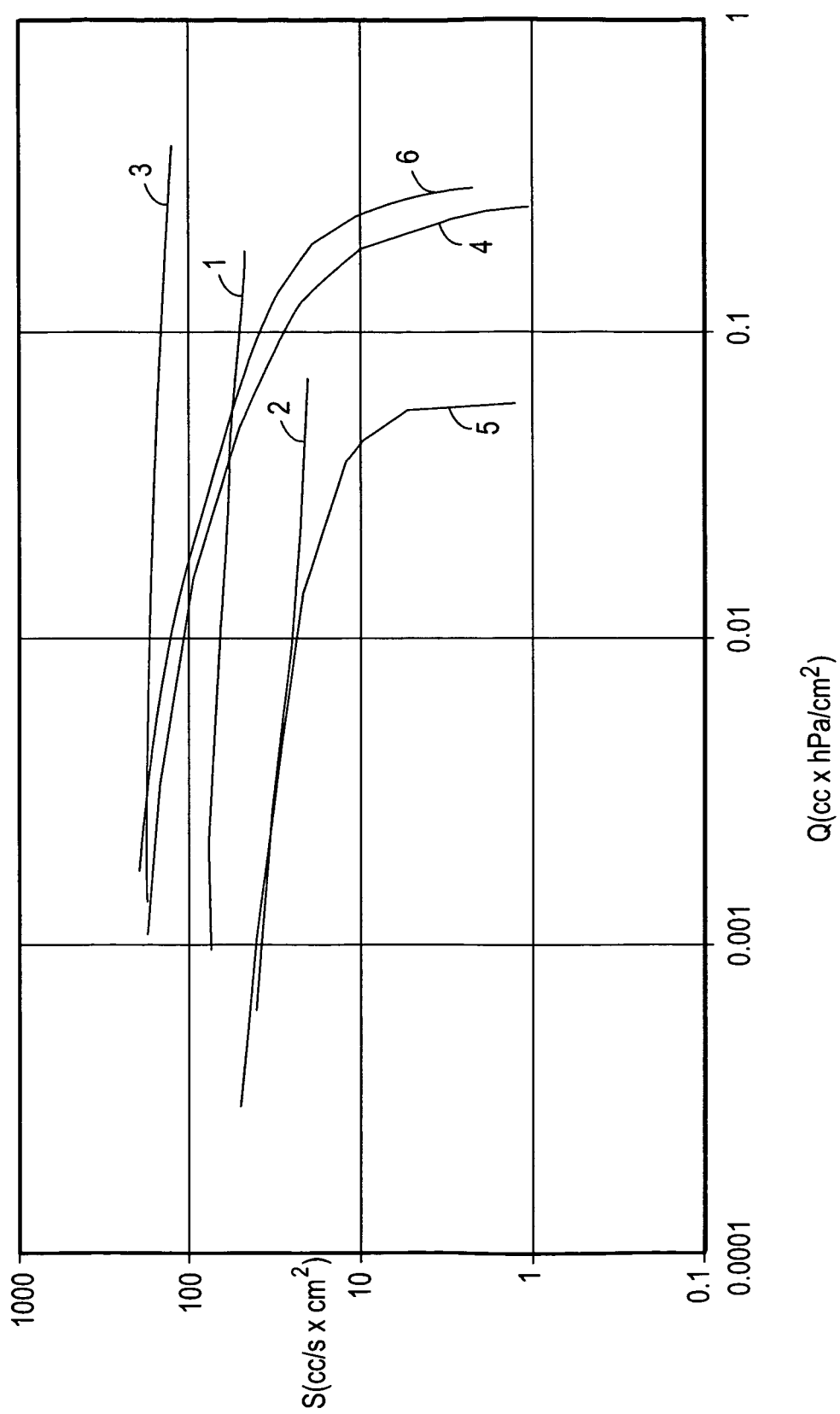
FIGS. 4 and 5 depict graphs representative of gas sorbing characteristics of getter deposits.

The results of the six tests are illustrated in the graph of FIG. 4 (in double logarithmic scale), as gas sorbing rate, S (measured in cc of gas sorbed per second and per square centimeter of deposit) as a function of the amount of gas sorbed, Q (measured in cc of gas sorbed multiplied by the pressure of measure in hectoPascal, hPa, per square centimeter of deposit). In the graph of FIG. 4, plots 1, 2, and 3 are associated with hydrogen sorption. In particular, plot 1 is associated with hydrogen sorption of the reference sample, plot 2 is associated with hydrogen sorption of the second sample disk, which was treated with SC1 solution, and plot 3 is associated with hydrogen sorption of the third sample disk, which was treated with SC1 solution and then treated with SC2 solution. Plots 4, 5, and 6 are associated with CO sorption. In particular, plot 4 is associated with CO sorption of the reference sample, plot 5 is associated with CO sorption of the second sample disk, and plot 5 is associated with CO sorption of the third sample disk.

The experimental results show that treatment with SC1 alone (plots 2 and 5) has an adverse impact on sorption performance, compared with the reference sample (plots 1 and 4). This behavior is hypothesized to be due to nitrogen contamination of the getter surface, nitrogen likely coming from the dissociation of $NH_4OH$, although there may be other explanations. The getter film, however, still has enough sizeable sorption capacity to assure a long life to the vacuum packaged MEMS devices.

While the SC1 treatment (plots 2 and 5) makes the sorbing characteristics of the getter films both of hydrogen and of CO worse, the subsequent treatment with SC2 (plots 3 and 6) produces an improvement in sorption capabilities. As shown in the graph of FIG. 4, hydrogen sorption was increased to about three times that of the reference sample (plots 1 and 4), and the rate and the capability of sorbing CO increased by about one order of magnitude. As a result of this caustic chemical fluid treatment of the getter materials, the getter materials may have been at least partially chemically activated.

In the case of the combination of SC1 and SC2 (plots 3 and 6), the results surprisingly show that this sequence of wet chemical treatment leaves comparable or even better sorption characteristics to the getter film in comparison to the reference sample (plots 1 and 4) without any cleaning. This behavior is hypothesized to be due to the neutralization of the SC1 attack by the SC2 solution although there may be other explanations. This result is opposite what would have been predicted by one of skill in the art of semiconductor processing, particularly in view of the degradation of the sorption characteristics of the getter material by the SC1 process.

Example 2

The compatibility of a support with a deposit of getter material with the treatment with aqueous solutions of nitric acid at different temperatures for different period of times is explored.

Four sample wafers similar to those produced for the example 1 are prepared. A first of these is not subjected to any treatment and constitutes the reference sample; a second is immersed for 30 minutes in an aqueous solution of $HNO_3$ at 65% by weight at room temperature; a third is immersed in the same solution for 10 minutes at 60° C.; and a fourth is immersed in the same solution for 10 minutes at 120° C.

Also in this case the four sample wafers, after an optional washing and drying with nitrogen, are analyzed from the point of view of the detachment from support and of the loss of particles. It was visibly confirmed that the treatments in nitric acid do not alter these two parameters with respect to the reference sample wafer.

Figure 5:
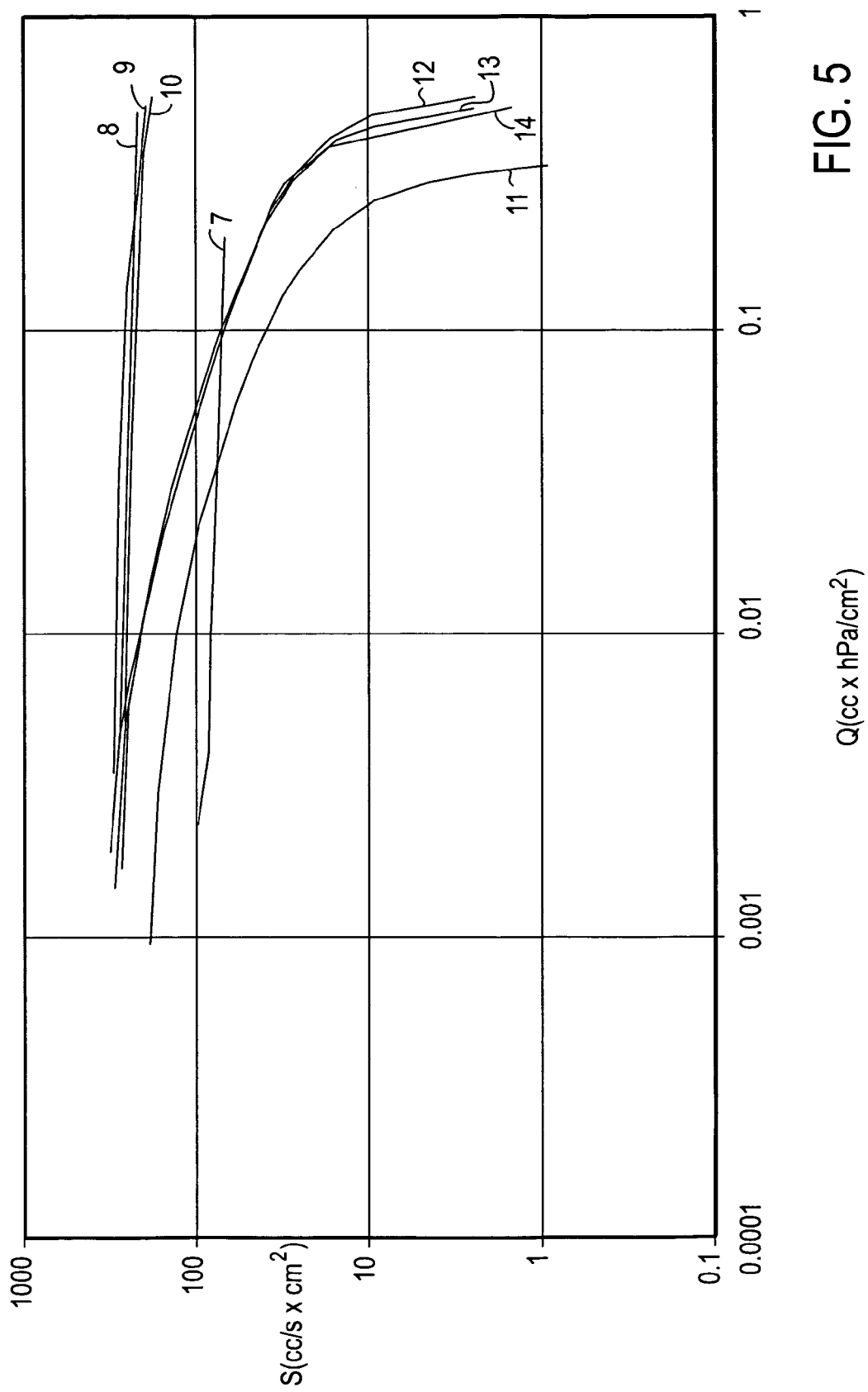

The four samples were subjected to hydrogen and CO sorbing tests, similar to those described previously in Example 1. All the three treatments tested with nitric acid in Example 2 give sorbing characteristics of both hydrogen and CO comparable one to the other, and also in this case sensibly better than those of the reference sample. The results of the test are illustrated in FIG. 5, as plots 7 to 10 for hydrogen sorption of the four sample wafers, and plots 11-14 for CO sorption of the four sample wafers. The results show that getter film can withstand all three $HNO_3$ treatments even at high temperatures.

Although treatments, such as those described in Examples 1 and 2, seem to improve the life of a device, another notable aspect is that the getter beneficially operates during manufacturing as a "process getter". For example, the getter may act as a sponge that removes gasses that are released during high-temperature operations when manufacturing a device. This is advantageous in the production of MEMS devices, for example, where two wafers (one on which a miniaturized device is built and the other carrying a getter layer) are bonded together using a bonding mechanism (e.g., anodic bonding, eutectic bonding, direct bonding, etc.) that is typically carried out at high temperatures (which can vary from process to process). Nevertheless, during the bonding process, gasses released by the materials making up the MEMS device tend to be entrapped in the device cavity. The getter is activated during this process, and the more the getter is active, the cleaner the inner atmosphere of the device cavity from the outset of the MEMS device's life. In this example, having a getter with gas-sorbing activity that has been enhanced in a previous cleaning process improves the working of the getter as a process getter.

Wet-mechanical treatment technologies, such as centrifugal spraying, water jets, brush scrubbing, pressurized fluids, and cryogenic particle jets have been developed for post-CMP and BEOL application, but are also diffused in the MEMS industries. Brush scrubbing is considered one of the most effective methods for removing slurry. It is used for particle reduction as well. Care should be taken not to damage the wafer surfaces with high pressure water sprays and nylon brushes. For example, brushes made of polyvinyl alcohol (PVA), a soft, highly compressible, sponge-like material, could be used for submicron particle removal without damaging the getter film surface.

Dry processes, such as cryogenic processes, have been adapted for very specific spot treatment. Using, for example, aerosol processing, cryogenics uses either carbon dioxide or an argon/nitrogen gas source. The liquid is expanded through special nozzles to generate a fast-moving stream of "snow flakes" and carbon dioxide gas. The frozen cluster dislodges particles, which are then swept away by the gas stream. Getter film at the wafer level can typically withstand carbon dioxide snow treatment without degrading the getter surface.

Figure 6:
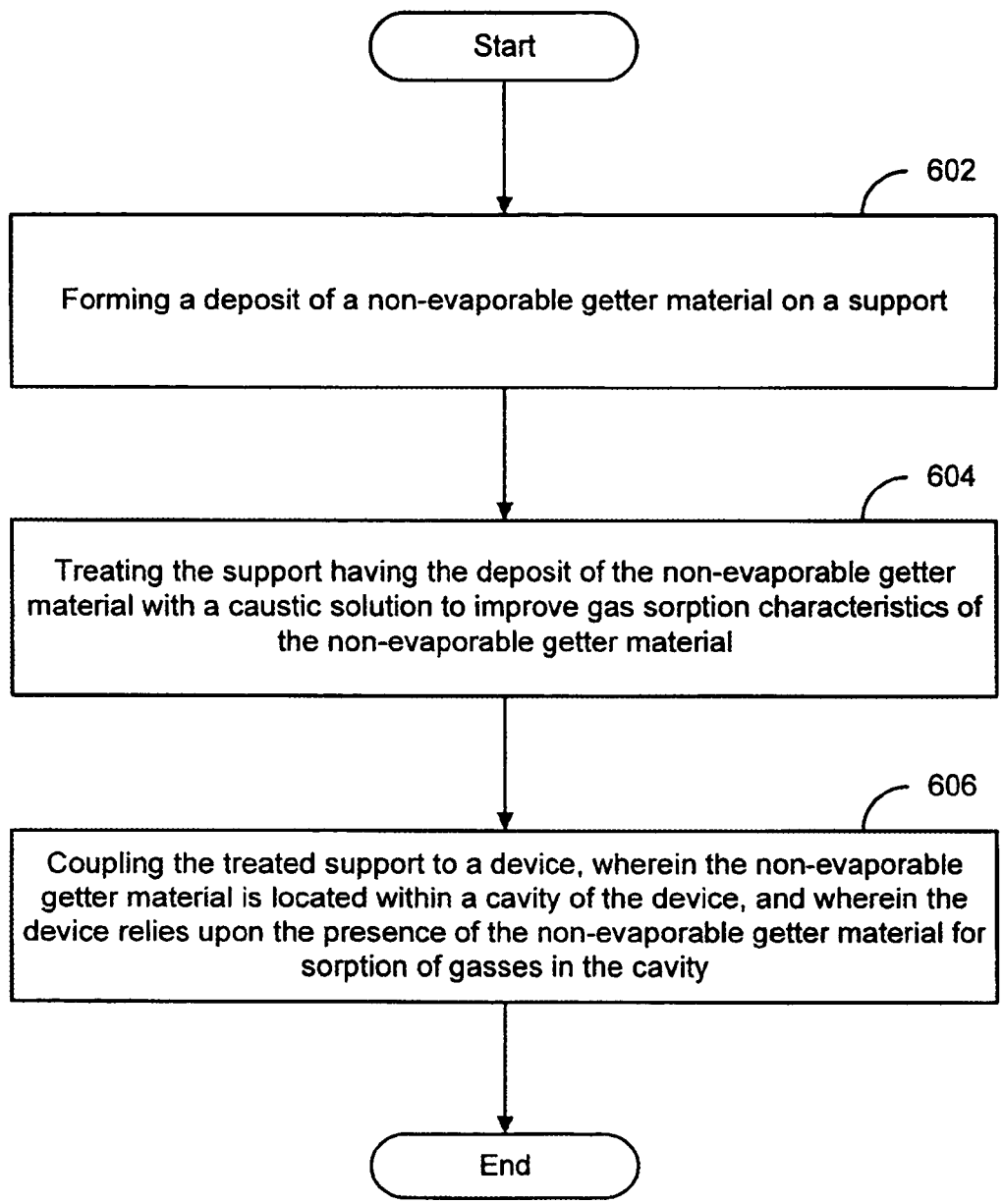
FIGS. 6 and 7 depict flowcharts of several exemplary manufacturing methods.

FIG. 6 depicts a flowchart 600 of a manufacturing process according to an exemplary embodiment. The process flowchart 600 begins with an act 602 of forming a deposit of non-evaporable getter material on a support. The deposit may be formed using any chemical, physical, or other deposition technique. For one example, the deposit may be formed using sputtering. The non-evaporable getter material may, for example, include a metal such as zirconium, titanium, tantalum, niobium, hafnium, or yttrium, or alloys of one of the metals with one or more transition metals, Rare Earths, or aluminum. The support may, for example, include glass, quartz, a ceramic material (e.g., silicon carbide) or a semiconductor material (e.g., silicon). The support may, for example, be used as a cap-wafer part of a micromechanical, microelectromechanical, or optical device. An active component of a micromechanical, microelectromechanical, or optical device may or may not be coupled to the support.

Next, in an act 604 the support having the deposit of the non-evaporable getter material is treated with a caustic solution to improve gas sorption characteristics of the non-evaporable getter material. The treatment may, for example, include a bath in one or more caustic solutions. For example, the treatment may include treating the support in a basic solution and treating the support in an acidic solution. A caustic solution may, for example be a basic solution that contains ammonia. A caustic solution may, for another example, be an acidic solution that contains hydrochloric acid, hydrofluoric acid, nitric acid, or sulfuric acid.

The treatment of the support at, for example, module 604 may serve several purposes. For example, the treatment may clean the support, clean the non-evaporable getter material, and improve gas sorption characteristics (e.g., at least partially "activate") of the non-evaporable getter material. Alternatively, the treatment of the support may include one or more of the purposes of cleaning the non-evaporable getter material and improving gas sorption characteristics of the non-evaporable getter material. In some cases, the treatment may be described as for the purpose of cleaning the support, cleaning the non-evaporable getter material, or cleaning both the support and the non-evaporable getter material, without mention of the improved gas sorption characteristics of the non-evaporable getter material. It should be understood, however, that treatment according to, for example, embodiments described herein has the added benefit of improving gas sorption characteristics of the getter material. Accordingly, a treatment that is described as solely for cleaning, but that also improves gas sorption characteristics of the non-evaporable getter material, may be properly described as treatment to improve gas sorption characteristics of getter material.

Next, in an act 606, the treated support is coupled to a device, wherein the non-evaporable getter material is located within a cavity of the device, and wherein the device relies upon the presence of the non-evaporable getter material for sorption of gasses in the cavity. The device may, for example, be a micromechanical, microelectromechanical, optical device or other device, apparatus or system. The support may, for example, include a cap-wafer part of a micromechanical, microelectromechanical, or optical device. An active component of a micromechanical, microelectromechanical, or optical device may be coupled to the support. The getter material may, for example, serve as a process getter for sorbing gasses during a bonding procedure. The cavity may, for example, be a vacuum, substantially evacuated, low pressure, high pressure, or include an inert atmosphere.

This method and other methods are depicted as serially arranged modules. However, modules of the methods may be reordered, or arranged for parallel execution as appropriate.

Figure 7:
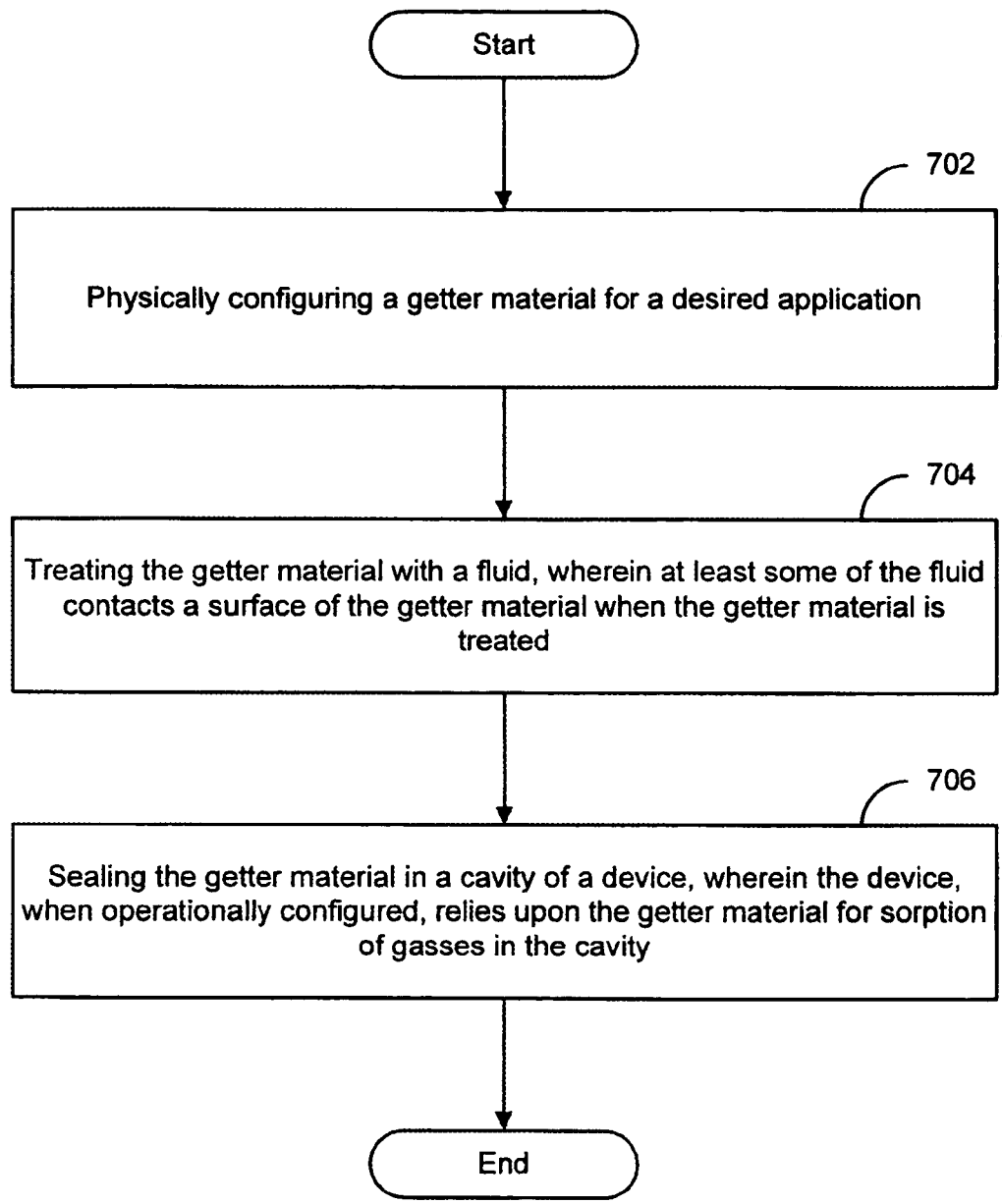

FIG. 7 depicts a process flowchart 700 of a manufacturing method according to another exemplary embodiment. The process flowchart 700 starts with an act 702 physically configuring a getter material for a desired application. Physical configuring may, for example, include forming the getter material on a support or as part of a device. For example, the getter material may be formed on a cap of the device or on the base of the device. Physical configuring may, for example, include sputtering. The desired application may, for example, include the manufacture of micromechanical, microelectromechanical, or optical devices.

The process flowchart 700 continues with an act 704 by treating the getter material with a fluid, wherein at least some of the fluid contacts a surface of the getter material when the getter material is treated. The fluid may, for example, be a caustic fluid. For example, the fluid may be a predominantly acidic fluid or a predominantly basic fluid. An acid has a pH of less than 7, while an alkali has a pH of greater than 7. A predominantly acidic fluid may be referred to as having a pH of less than about 6 and may even have a negative pH in the case of a very strong acid. A predominantly basic solution may be referred to as having a pH of greater than about 8, but could conceivably have a pH of greater than 15. An acidic solution may be considered a strong acid at about 3 or lower pH, and a basic solution may be considered a strong alkali at about 11 or higher pH. The caustic fluid utilized in various embodiments may have a number of different pH that depend upon the materials being cleaned, activated, or otherwise treated. Adjusting the pH of the various fluids may change the results of treatment. In an embodiment, a first caustic fluid includes a predominantly basic component and a second caustic fluid includes a predominantly acidic component. The treating may, for example, include one or more of removing contaminants, enhancing the gettering capabilities of the getter material, or maintaining the structural integrity of the getter material.

The process flowchart 700 continues with an act 706 with sealing the getter material in a cavity of a device, wherein the device, when operationally configured, relies upon the getter material for sorption of gasses in the cavity.

It will be appreciated by those skilled in the art that the preceding examples, embodiments and aspects are exemplary and not limiting to the scope of the claimed invention. It is intended that all permutations, enhancements, equivalents, and improvements thereto that are apparent to those skilled in the art upon a reading of the specification and a study of the drawings are included within the true spirit and scope of the present invention.

What is claimed is:

1. A process for manufacturing a device, comprising:
   forming a deposit of a non-evaporable getter material on a support;
   treating the support having the deposit of the non-evaporable getter material with a caustic solution to improve gas sorption characteristics of the non-evaporable getter material, wherein treating the support with a caustic solution maintains the structural integrity of the non-evaporable getter material; and
   coupling the treated support to a device, wherein the non-evaporable getter material is located within a cavity of the device, and wherein the device relies upon the presence of the non-evaporable getter material for sorption of gasses in the cavity.

2. The process of claim 1, wherein the caustic solution includes ammonia.

3. The process of claim 1, wherein the caustic solution includes an acid selected from the group consisting of hydrochloric acid, hydrofluoric acid, nitric acid, and sulfuric acid.

4. The process of claim 1, wherein the treatment with caustic solution further comprises:
   treating the support in a basic solution including ammonia; and
   treating the support in an acidic solution including an acid selected from the group consisting of hydrochloric acid, hydrofluoric acid, nitric acid, and sulfuric acid.

5. The process of claim 1, wherein the device includes a miniaturized micromechanical, microelectromechanical, or optical device.

6. The process of claim 1, wherein the support includes a cap-wafer part of a micromechanical, microelectromechanical, or optical device.

7. The process of claim 1, wherein an active component of a micromechanical, microelectromechanical, or optical device is coupled to the support.

8. The process of claim 1, wherein the non-evaporable getter material includes a metal selected from the group consisting of zirconium, titanium, tantalum, niobium, hafnium, vanadium, and yttrium, or alloys of at least one of the metals with one or more elements selected from the group consisting of transition metals, Rare Earths, and aluminum.

9. The process of claim 1, wherein said forming further includes sputtering the non-evaporable getter material onto the support.

10. A method for chemically preparing getter material surfaces, comprising:
    physically configuring a getter material for a desired application;
    treating the getter material with a fluid that improves gas sorption characteristics of the getter material, wherein at least some of the fluid contacts a surface of the getter material when the getter material is treated, and wherein treating the getter material with a fluid maintains the structural integrity of the getter material; and
    sealing the getter material in a cavity of a device, wherein the device, when operationally configured, relies upon the getter material for sorption of gasses in the cavity.

11. The method of claim 10, wherein said treating includes removing contaminants.

12. The method of claim 10, wherein said treating includes enhancing the gettering capabilities of the getter material.

13. The method of claim 10, wherein said treating includes maintaining the structural integrity of the getter material.

14. The method of claim 10, wherein the fluid is a predominantly acidic fluid.

15. The method of claim 10, wherein the fluid is a predominantly basic fluid.

16. The method of claim 10, wherein the fluid is a first caustic fluid, further comprising treating the getter material with a second caustic fluid.

17. The method of claim 16, wherein the first caustic fluid is primarily basic and the second caustic fluid is primarily acidic.

18. The method of claim 10, wherein said physically configuring further comprises configuring the getter material as part of the device, wherein the device is selected from the group consisting of micromechanical, microelectromechanical, and optical devices.

19. The method of claim 10, wherein said physically configuring further comprises configuring the getter material on a cap for the device, wherein the device is selected from the group consisting of micromechanical, microelectromechanical, and optical devices.

20. The method of claim 10, wherein said physically configuring further comprises configuring the getter material on a base for the device, wherein the device is selected from the group consisting of micromechanical, microelectromechanical, and optical devices.

21. The method of claim 10, wherein said physically configuring further comprises sputtering.

22. The process of claim 1, wherein the non-evaporable getter material comprises a Zr—Co-rare earth alloy.

23. The method of claim 10, wherein the getter material comprises a Zr—Co-rare earth alloy.

* * * * *